US007020016B2

(12) United States Patent
Ferrant et al.

(10) Patent No.: US 7,020,016 B2
(45) Date of Patent: Mar. 28, 2006

(54) RANDOM ACCESS MEMORY CELL AND METHOD FOR FABRICATING SAME

(75) Inventors: Richard J. Ferrant, Saint Ismier (FR); Tsin C. Chan, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/937,424

(22) Filed: Sep. 7, 2004

(65) Prior Publication Data
US 2005/0032277 A1 Feb. 10, 2005

Related U.S. Application Data

(62) Division of application No. 10/330,864, filed on Dec. 27, 2002, now Pat. No. 6,808,990, which is a division of application No. 09/607,780, filed on Jun. 30, 2000, now Pat. No. 6,583,459.

(51) Int. Cl.
*G11C 11/34* (2006.01)

(52) U.S. Cl. ............................ 365/180.24; 365/189.08; 257/296; 438/275

(58) Field of Classification Search .............................. 365/185.24–185.26, 189.01, 189.08, 189.11; 257/295, 296; 438/275
See application file for complete search history.

(56) References Cited

U.S. PATENT DOCUMENTS

| 5,475,633 | A | * | 12/1995 | Mehalel ...................... 365/154 |
| 5,488,579 | A | * | 1/1996 | Sharma et al. .......... 365/185.08 |
| 5,965,922 | A | * | 10/1999 | Matsui ........................ 257/369 |
| 5,994,738 | A | * | 11/1999 | Wollesen ..................... 257/347 |
| 6,038,163 | A | | 3/2000 | Clemens et al. |
| 6,097,065 | A | * | 8/2000 | Forbes et al. ................ 257/350 |
| 6,172,899 | B1 | * | 1/2001 | Marr et al. .................. 365/154 |
| 6,177,694 | B1 | * | 1/2001 | El Hajji ....................... 257/296 |
| 6,222,780 | B1 | * | 4/2001 | Takahashi ............... 365/189.09 |
| 6,229,342 | B1 | * | 5/2001 | Noble et al. ................. 326/102 |
| 6,308,163 | B1 | * | 10/2001 | Du et al. ........................ 705/8 |
| 6,569,723 | B1 | * | 5/2003 | Liaw ........................... 438/153 |
| 6,606,263 | B1 | * | 8/2003 | Tang ........................... 365/158 |
| 6,728,145 | B1 | * | 4/2004 | Knupfer et al. ............. 365/194 |
| 6,888,747 | B1 | * | 5/2005 | Salling et al. ............... 365/171 |
| 6,888,760 | B1 | * | 5/2005 | LaBerge ................. 365/189.01 |
| 2001/0030893 | A1 | * | 10/2001 | Terzioglu et al. ........... 365/200 |

FOREIGN PATENT DOCUMENTS

JP 06-104405 * 4/1994

(Continued)

OTHER PUBLICATIONS

EPO; European Search Report on EP Appl. No. 013052634; Oct. 25, 2001.*

(Continued)

*Primary Examiner*—T. N. Quach
(74) *Attorney, Agent, or Firm*—Lisa K. Jorgenson; Andre M. Szuwalski (57) ABSTRACT

A data value is stored in a random access memory cell by driving the bit lines of the cell to complementary values representative of the value. The word line for the cell is driven to make a cell selection and cause the data value to be loaded into the cell from the bit lines. Thereafter, the word line is deselected. Following deselection, both bit lines are discharged to a logic low level. During discharging, however, a leakage current is allowed to flow through at least one of the bit lines so that the memory cell maintains the stored data value.

10 Claims, 6 Drawing Sheets

| FOREIGN PATENT DOCUMENTS | | |
|---|---|---|
| JP | 04252626 | 4/1994 |
| JP | 11170476 | 1/2001 |
| JP | 2001006370 | * 1/2001 |

OTHER PUBLICATIONS

European Search Report, EP01305263, dated Oct. 15, 2001.

* cited by examiner

RANDOM ACCESS MEMORY CELL AND METHOD FOR FABRICATING SAME

The present application is a Divisional of U.S. patent application Ser. No. 10/330,864, filed Dec. 27, 2002 now U.S. Pat. No. 6,808,990. U.S. patent application Ser. No. 10/330,864 is a Divisional of U.S. patent application Ser. No. 09/607,780, filed Jun. 30, 2000, now U.S. Pat. No. 6,583,459.

BACKGROUND OF THE INVENTION

1. Technical Field of the Invention

The present invention relates to a volatile memory cell circuit, and particularly to a memory cell circuit for a static random access memory device.

2. Background of the Invention

Static random access memory (SRAM) devices have been employed for decades to store electronic data. An SRAM device includes an array of memory cells organized into rows and columns of memory cells. An addressable word line is coupled to the memory cells in a distinct row of memory cells. The memory cells in a column of memory cells are coupled to an addressable pair of bit lines. Data is written to and read from a memory cell in the memory cell array by selecting a row of memory cells and accessing memory cells therein that are coupled to selected bit line pairs. The organization and operation of SRAM devices are well known in the art.

The conventional SRAM cell is a six transistor (6T) cell. Specifically, the SRAM includes a latch element formed by a pair of cross coupled inverters. The latch element stores a single bit of data, with the value of the data bit depending upon the state of the latch element. The conventional SRAM cell includes a pair of transmission or pass gate transistors coupled to the input of the cross-coupled inverters. The pass gate transistors provide access to the SRAM for reading and writing data. The 6T SRAM cell is well known in the art.

Over the years, attempts have been made to optimize the SRAM cell. Improvements have occurred primarily with respect to memory cell layout and/or fabrication techniques. Little changes, however, have been directed to reducing the circuit itself so as to reduce fabrication complexity.

SUMMARY OF THE INVENTION

In accordance with an embodiment of the invention, a method is presented for storing a data value in a volatile memory device having at least one memory cell, a word line and a pair of bit lines being coupled to the at least one memory cell. The method comprises driving the pair of bit lines to complementary voltage levels representative of a data value to be stored. The word line is driven to a voltage level to select the at least one memory cell and to thereby cause the at least one memory cell to be in a logic state representative of the data value to be stored. The word line is then driven to a voltage level to deselect the at least one memory cell. Following the step of driving the word line to a voltage level to deselect the at least one memory cell, the pair of bit lines are discharged to a voltage representative of a logic low level. During the step of discharging the pair of bit lines, a leakage current is allowed to flow through at least one of the bit lines so that the memory cell maintains the data value stored therein.

In accordance with another embodiment, a method is presented for storing data value in a memory device. A pair of bit lines are driven to a voltage representative of a logic high level. A word line is driven to a voltage representative of a logic low level to select at least one memory cell and to thereby cause the at least one memory cell to be in a logic state representative of the data value to be stored. The word line is then driven to a voltage representative of a logic high level to deselect the at least one memory cell. Subsequent to driving the word line to the voltage representative of the logic high level to deselect the at least one memory cell, the pair of bit lines are discharged to a voltage representative of a logic low level. During discharging the pair of bit lines, a subthreshold current is allowed to flow through at least one of the bit lines so that the memory cell maintains the data value stored therein.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE PREFERRED EXEMPLARY EMBODIMENTS

The present invention will now be described more fully hereinafter with reference to the accompanying drawings in which a preferred embodiment of the invention is shown. The embodiment is provided so that this disclosure will be thorough and complete.

An embodiment of the present invention is directed towards a volatile memory device, and particularly to a memory cell therefor. The embodiment of the present invention is illustrated in the drawings and described below as a static random access memory (SRAM) device, but it is understood that embodiments of the present invention may be implemented as other volatile memory devices, such as a dynamic random access memory device.

Figure 1:
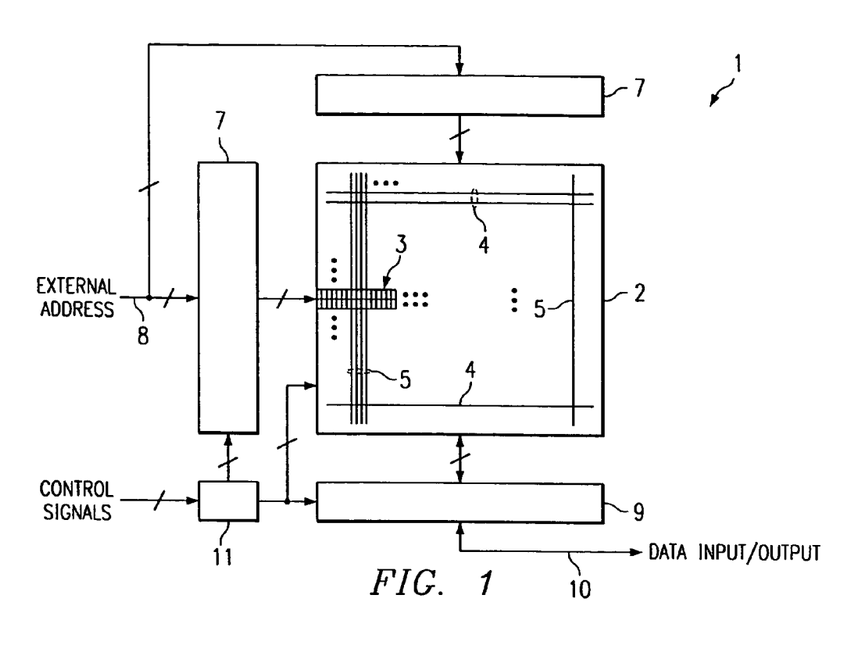
FIG. 1 is a function block diagram of an SRAM device according to an embodiment of the present invention.

Referring to FIG. 1, there is disclosed a static random access memory (SRAM) device 1 according to an exemplary embodiment of the present invention. The SRAM device 1 is a volatile memory device that stores bits of data without the need for refresh operations in order to maintain data integrity.

The SRAM device 1 may include at least one memory cell array 2 that is organized into rows and columns of memory cells 3. Each row of memory cells is coupled to a distinct word line 4, and each column of memory cells is coupled to a distinct pair 6 of bit lines 5.

The SRAM device 1 may further include an address decode block 7 that receives as an input an external address 8, the value of which identifies one or more specific memory cells 3. Based upon the value of external address 8, address decode block 7 drives the corresponding word line 4 to a voltage level so as to connect the memory cells 3 in the selected row to bit lines 5. SRAM device 1 may further include an input/output (I/O) block 9 that serves as an interface for data 10 read from or to be written to memory cell array 2. Address decode block 7 may also connect columns of memory cells and/or pairs 6 of bit lines 5 to I/O block 9 based upon the value of external address 8. SRAM device 1 may include a control block 11 for performing a number of functions, such as charging bit lines 5 to a high reference voltage level prior to and/or between the execution of memory access operations.

Figure 2:
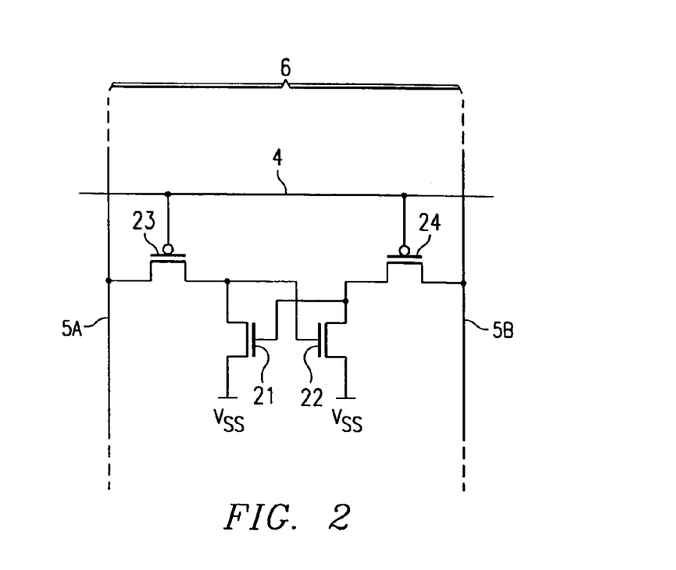
FIG. 2 is a schematic diagram of an SRAM cell from the SRAM device of FIG. 1 according to an embodiment of the present invention.

As stated above, memory cell array 2 includes a plurality of SRAM cells 3 organized into rows and columns. FIG. 2 illustrates one SRAM cell 3 according to a first exemplary embodiment of the present invention, together with a word line 4 and a pair 6 of bit lines 5A and 5B coupled to SRAM cell 3. SRAM cell 3 is illustrated in FIG. 2 as including MOS transistors for exemplary purposes only. It is understood that SRAM cell 3 may be implemented with other components, such as with transistors other than MOS transistors.

In accordance with an embodiment of the present invention, SRAM cell 3 includes a first pull-down transistor 21 and a second pull-down transistor 22. Pull-down transistors 21 and 22 may be n-channel MOS transistors. A first conduction and/or source terminal of first and second pull-down transistors 21 and 22 is coupled to a low reference voltage source Vss. A second conduction and/or drain terminal of first pull-down transistor 21 is coupled to the control and/or gate terminal of second pull-down transistor 22. A second conduction and/or drain terminal of second pull-down transistor 22 is coupled to the control and/or gate terminal of first pull-down transistor 21.

The SRAM cell 3 further includes transmission and/or pass gate transistors 23 and 24. Transmission gate transistors 23 and 24 may be p-channel MOS transistors, but it is understood that transmission gate transistors 23 and 24 may be other transistors, such as n-channel MOS transistors. A first transmission gate transistor 23 has a first conduction or drain/source terminal coupled to a first bit line 5A of bit line pair 6. A second conduction or drain/source terminal of first transmission gate transistor 23 is coupled to the drain terminal of first pull-down transistor 21 and the gate terminal of second pull-down transistor 22. Similarly, a second transmission gate transistor 24 has a first conduction or drain/source terminal coupled to a second bit line 5B of bit line pair 6. A second conduction or drain/source terminal of second transmission gate transistor 24 is coupled to the drain terminal of second pull-down transistor 22 and the gate terminal of first pull-down transistor 21. The gate terminals of transmission gate transistors 23 and 24 are coupled to a word line 4.

According to the embodiment of the present invention, SRAM cell 3 does not include pull-up transistors that are found in conventional SRAM cells. Consequently, the steps necessary for fabricating SRAM device 1 are reduced, thereby reducing fabrication costs.

Despite the absence of pull-up transistors, each SRAM cell 3 nonetheless performs a latching function to effectuate storing a bit of data. Specifically, SRAM device 1, like conventional or existing SRAM devices, charges or otherwise normally maintains both bit lines 5A and 5B at the high reference voltage level Vdd when SRAM cell 3 is not being accessed. Because first and second transmission gate transistors 23 and 24 are turned off when SRAM cell 3 is not being accessed, the operating and/or electrical characteristics of transmission gate transistors 23 and 24 are such that a subthreshold current flows from bit lines 5A and 5B through transmission gate transistors 23 and 24, respectively, when transmission gate transistors 23 and 24 are turned off. This subthreshold current, that flows from bit lines 5 (normally tied to high reference voltage Vdd) and through the transmission gate transistors 23 and 24, is sized so that the drain terminal of the turned off pull-down transistor is pulled to a voltage level representative of a logic high voltage level. Maintaining the voltage level of the drain terminal of the turned-off pull-down transistor within the logic high voltage level range ensures that the other pull-down transistor, the pull-down transistor that is turned on, remains turned on. With the turned-on pull-down transistor remaining in a turned-on state, the drain terminal of the turned-on transistor remains pulled towards the low reference voltage level Vss, thereupon maintaining the turned-off pull-down transistor in the turned-off state. In this way, SRAM cell 3 maintains its latched state following a memory access operation and thus preserves the data value corresponding to the latched state.

Because a non-trivial subthreshold current level is needed to maintain SRAM cell 3 in the desired latched state and noting that thin film transistors typically have higher subthreshold current levels than the subthreshold current levels in bulk (substrate) transistors, transmission gate transistors 23 and 24 are thin film transistors. Alternatively, transmission gate transistors 23 and 24 may be other types of transistors, such as bulk transistors configured to allow the requisite subthreshold current level.

During normal operation of SRAM device 1, bit lines 5 are charged or otherwise maintained at the high reference voltage level Vdd. During a memory access operation, either a memory read or write operation, word line 4 is driven towards a low reference voltage level Vss, which turns on transmission gate transistors 23 and 24 and thereby couples the drain terminals of pull-down transistors 21 and 22 to bit lines 5A and 5B, respectively. For a memory write operation, data to be written to SRAM cell 3 appears on bit lines 5A and 5B and turns on a first one of pull-down transistors 21 and 22 and turns off a second one thereof. For a memory read operation, the latched state of SRAM cell 3 drives a first one of bit lines 5A and 5B (the bit line 5 coupled to the drain terminal of the turned on pull-down transistor) towards the low reference voltage level Vss and a second one of bit lines 5A and 5B (the bit line 5 coupled to the drain terminal of the turned off pull-down transistor) is substantially unaffected and thus remains at the high reference voltage level Vdd.

Following the memory access operation, word line 4 is driven to the high reference voltage level Vdd, which turns off transmission gate transistors 23 and 24 and thereby decouples the drain terminals of pull-down transistors 21 and 22 from bit lines 5A and 5B, respectively. At this time, the voltage appearing on bit lines 5A and 5B is returned to the high reference voltage level Vdd. SRAM cell 3 is now in a latched state wherein one of first pull-down transistor 21 and second pull-down transistor 22 is turned on and the other one is turned off. Assuming the latched state of SRAM cell 3 is such that first pull-down transistor 21 is turned on and second pull-down transistor 22 is turned off, the voltage of the drain terminal of first pull-down transistor 21 and the gate terminal of second pull-down transistor 22 is at approximately the low reference voltage level Vss. In addition, the voltage of the drain terminal of second pull-down transistor 22 and the gate of first terminal of the first pull-down transistor is approximately at the high reference voltage level Vdd.

With transmission gate transistors 23 and 24 turned off, a subthreshold current is provided thereby to the drain terminals of pull-down transistors 21 and 22. The subthreshold current provided by first transmission gate transistor 23 has little effect in changing the low reference voltage Vss appearing on the drain terminal of first pull-down transistor 21. The subthreshold current provided by second transmission gate transistor 24 serves to keep at approximately the high reference voltage level Vdd the drain terminal of second pull-down transistor 22 and the gate terminal of first pull-down transistor 21. This keeps first pull-down transistor 21 turned on and second pull-down transistor turned off. As a result, the subthreshold current provided by transmission gate transistors 23 and 24 serves to maintain SRAM cell 3 in its latched state.

A method of fabricating SRAM cell 3 will be described with reference to FIGS. 3A–3H. The exemplary fabrication method utilizes a four layer polycrystalline silicon, three layer metal process. The resulting SRAM cell 3 includes transmission gate transistors 23 and 24 having drain, source and drain regions formed in a third polycrystalline silicon (polysilicon) layer. The gate region of transmission gate transistors 23 and 24 are formed in a fourth polysilicon layer. The pull-down transistors 21 and 22 are bulk transistors having source and drain regions formed in the monocrystalline silicon substrate.

Figure 3A:
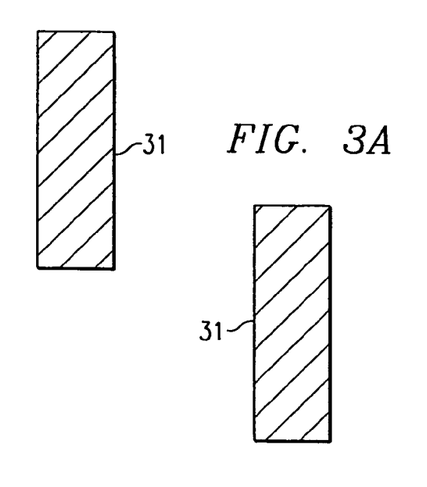
FIGS. 3A–3H are top plan views of an SRAM cell during fabrication, in accordance to an embodiment of the present invention.
Figures 3B, 3C:
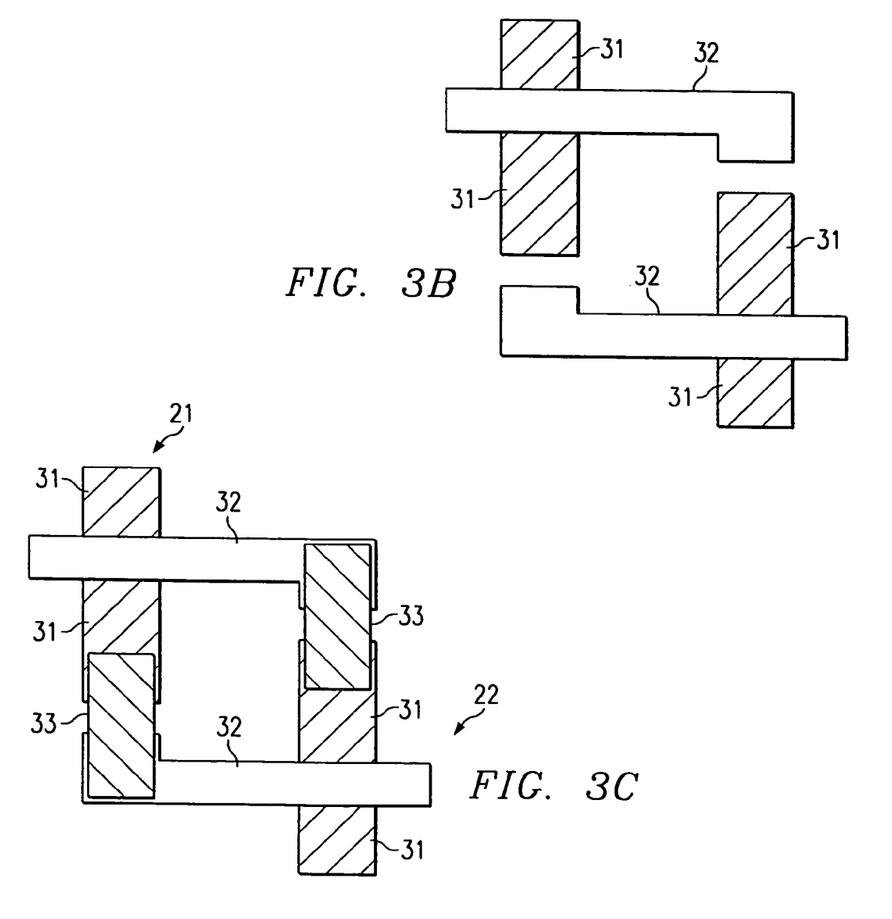
Figure 3D:
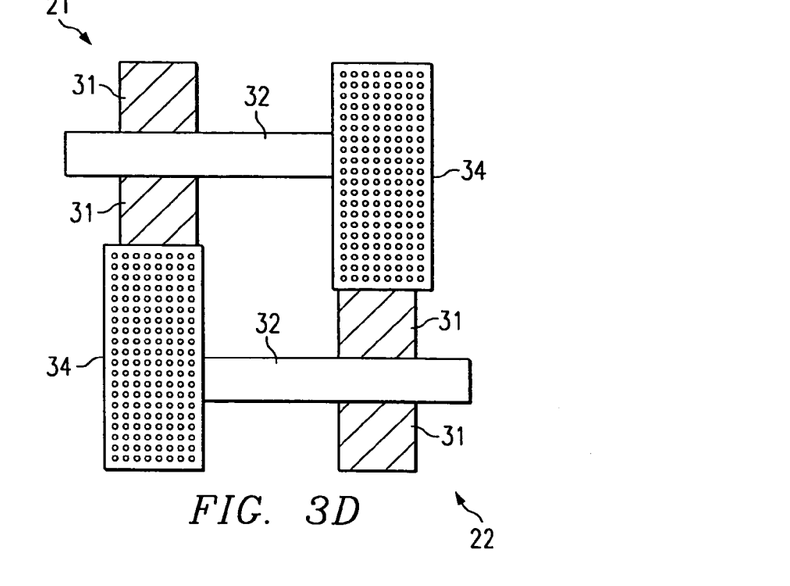

Initially, the active area 31 of first pull-down transistor 21 and second pull-down transistor 22 is defined in the silicon substrate, as shown in FIG. 3A. A thin dielectric layer (not explicitly shown) is formed over active areas 31 and forms the gate dielectric of first and second pull-down transistors 21 and 22. A thick field dielectric is formed elsewhere. Next, a first polysilicon layer 32 (FIG. 3B) is formed over the thin dielectric layer and defines the gate region of first and second pull-down transistors 21 and 22. A first interpoly dielectric layer is then formed over first polysilicon layer 32. At this point, n-type dopants may be diffused in the drain and source regions of the first and second pull-down transistors 21 and 22.

For the multiple polysilicon layer process, interpoly dielectric layers are disposed between successive polysilicon layers. The interpoly dielectric layers are not illustrated in the drawings for reasons of clarity.

A second polysilicon layer 33 (FIG. 3C) is formed over the semiconductor substrate to provide a contact to connect the drain terminal of first pull-down transistor 21 and the gate terminal of second pull-down transistor 22, and connect the drain terminal of second pull-down transistor 22 and the gate terminal of first pull-down transistor 21. A second interpoly dielectric is then formed over the second polysilicon layer 33. A third polysilicon layer 34 (FIG. 3D) is then formed over the semiconductor substrate so as to define the drain, source and channel regions of first and second transmission gate transistors 23 and 24. A third interpoly dielectric layer is then formed over the third polysilicon layer 34 and forms the gate dielectric of first and second transmission gate transistors 23 and 24.

Next, a fourth polysilicon layer 35 (FIG. 3E) is formed over the third interpoly dielectric layer so as to define the gate region of first and second transmission gate transistors 23 and 24. Contacts 36 are then formed over third polysilicon layer 34 and fourth polysilicon layer 35 so as to define openings for connections from SRAM cell 3 to bit lines 5, word line 4 and the source that provides the low reference voltage Vss to SRAM device 1.

Figure 3E:
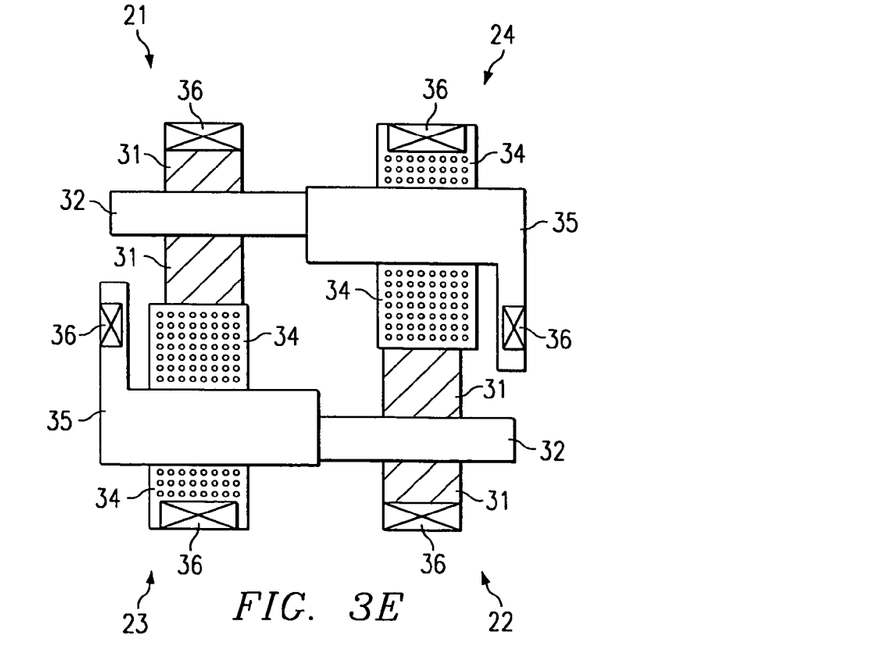
Figure 3F:
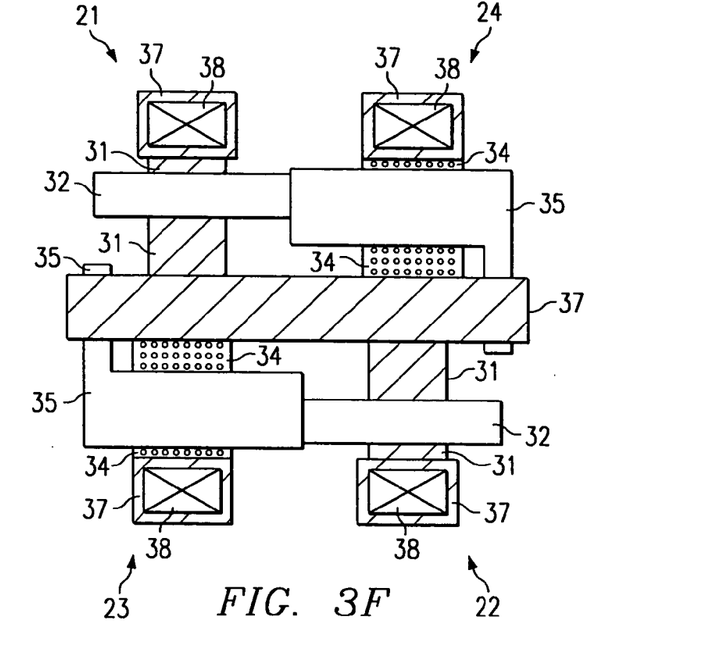
Figure 3G:
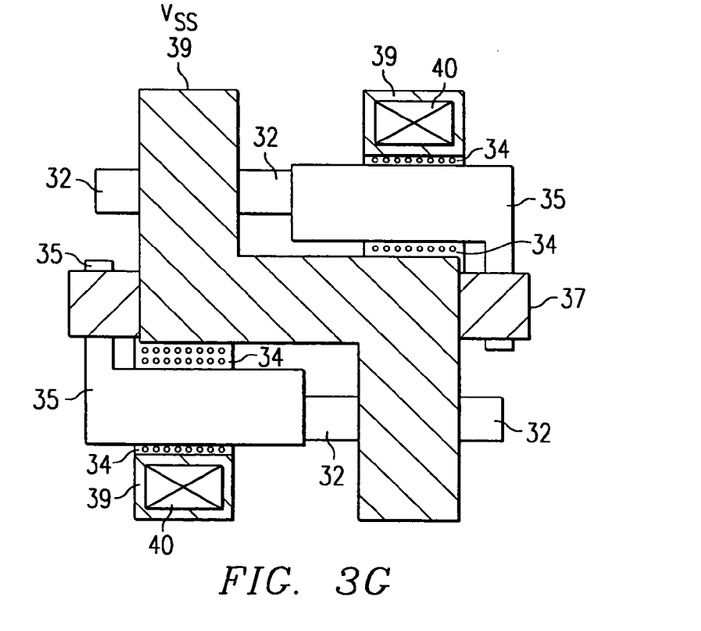

Following the formation of the transmission gate transistors 23 and 24, transmission gate transistors 23 and 24 are treated to provide the appropriate threshold voltage so that the desired subthreshold current level is provided to pull-down transistors 21 and 22 when transmission gate transistors 23 and 24 are turned off. The threshold voltage setting is based in part upon factors such as the high reference voltage level Vdd and the low reference voltage level Vss. For example, the channel region of transmission gate transistors 23 and 24 may be implanted with ions to achieve the appropriate threshold voltage.

Next, metallization is performed for completing the interconnectivity for SRAM cell 3 within memory cell array 2. It is understood that intermetal dielectric layers are disposed between successive metal layers. Intermetal dielectric layers will not be illustrated in the drawings for reasons of clarity.

A first metal layer 37 (FIG. 3F) pattern is defined over SRAM cell 3 for routing word line 4. First vias 38 are then defined over SRAM cell 3 to provide connectivity between the drain terminal of transmission gate transistor 23 and 24 and bit lines 5A and 5B, respectively, and between the source providing low reference voltage level Vss to SRAM device 1 and the source terminal of transmission gate transistors 21 and 22.

Figure 3H:
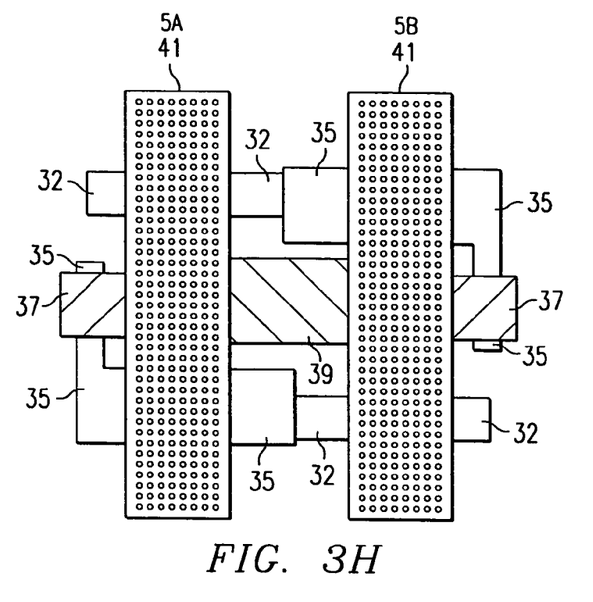

A second metal layer 39 (FIG. 3G) is then patterned over SRAM cell 3 so as to define, among other things, power bussing for low reference voltage Vss. Second vias 40 are then defined in SRAM cell 3. A third layer metal 41 is patterned over SRAM cell 3 for routing bit lines 5A and 5B through SRAM cell 3 and making connections to transmission gate transistors 23 and 24 (FIG. 3H).

It is understood that there are many other ways in which SRAM cell 3 may be fabricated. With transmission gate transistors 23 and 24 implemented as thin film transistors, transmission gate transistors 23 and 24 may be formed in at least one layer of polycrystalline semiconductor material. For instance, the gate region of transmission gate transistors 23 and 24 may be formed in the diffusion region within a monocrystalline semiconductor substrate, and the drain, source and channel regions of transmission gate transistors 23 and 24 may be formed in a first layer of polycrystalline material disposed over the semiconductor substrate.

Figure 4:
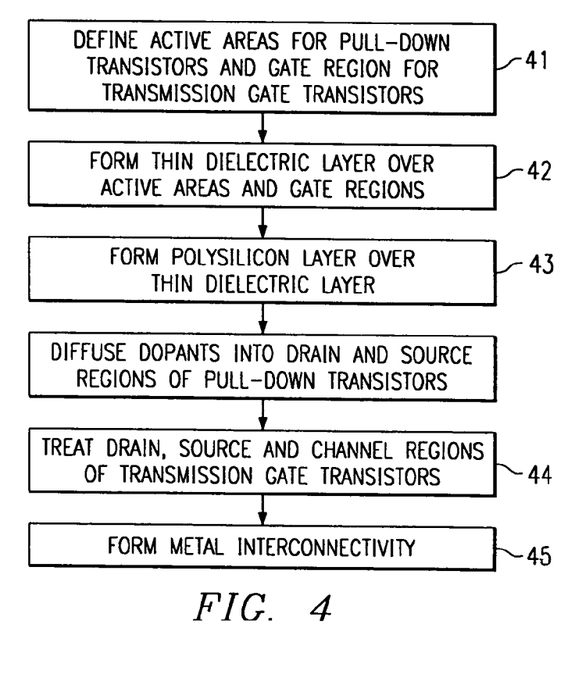
FIGS. 4–6 are flow charts illustrating steps of fabricating an SRAM cell according to other embodiments of the present invention.

With respect to the method of fabricating the SRAM cell 3 in which the gate region of transmission gate transistors 23 and 24 is formed in the semiconductor substrate and the drain, source and channel regions are formed in the first polycrystalline material layer, reference is made to FIG. 4. The method includes the step of defining the active areas for pull-down transistors 21 and 22, and the gate region of transmission gate transistors 23 and 24 (step 41). Next, a first thin dielectric layer is formed over the active areas and the gate region so as to define the gate dielectric of pull-down transistors 21 and 22 and transmission gate transistors 23 and 24 (step 42). Next, the first polysilicon layer is formed over the thin dielectric layer so as to define the gate region of pull-down transistors 21 and 22 and the drain, source and channel regions of transmission gate transistors 23 and 24 (step 43). Next, the drain, source and channel regions of transmission gate transistors 23 and 24 are treated to provide the desired conductivity and threshold voltage for transmission gate transistors 23 and 24 (step 44). Thereafter, one or more layers of metal may be formed over the substrate to provide interconnectivity to bit lines 5, word line 4 and the power bussing for low reference voltage level Vss (step 45).

Alternatively, the drain, source and channel regions of transmission gate transistors 23 and 24 may be formed in the first layer of polycrystalline material disposed over a thick dielectric layer covering a portion of the semiconductor substrate, and the gate region of transmission gate transistors 23 and 24 may be formed in, a second polycrystalline semiconductor layer that is separated from the first polycrystalline semiconductor layer by a second thin dielectric layer.

Figure 5:
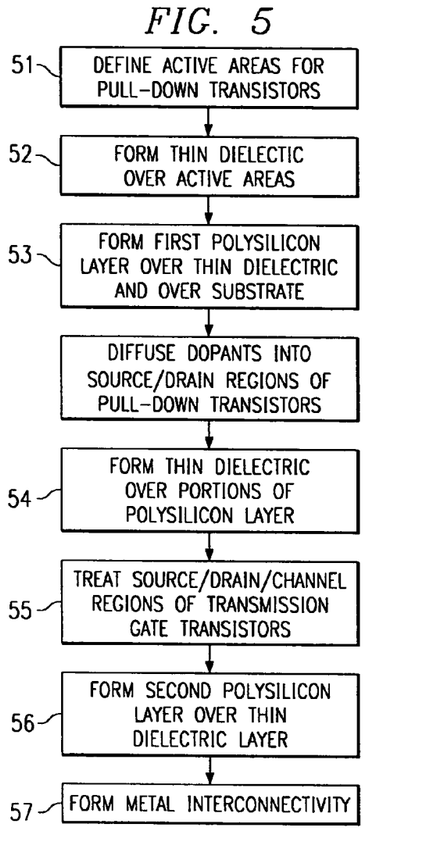

With respect to a method of fabricating the SRAM cell 3 in which drain, source and channel regions of transmission gate transistors 23 and 24 are formed in the first polysilicon layer and gate region is formed in the second polysilicon layer, reference is made to FIG. 5. The method includes the step of defining the active areas for pull-down transistors 21 and 22, (step 51). Next, a thin dielectric layer is formed over the active areas so as to define the gate dielectric of pull-down transistors 21 and 22 (step 52). Next, the first polysilicon layer is formed over the thin dielectric layer so as to define the gate region of pull-down transistors 21 and 22 and the drain, source and channel regions of transmission gate transistors 23 and 24 (step 53). A thin dielectric is formed over the channel region of transmission gate transistors 23 and 24 to define the gate dielectric thereof (step 54). Next, the drain, source and channel regions of transmission gate transistors 23 and 24 are treated to provide the desired conductivity and threshold voltage (step 55). A second polysilicon layer is formed over the gate dielectric layer of transmission gate transistors 23 and 24 (step 56). Thereafter, one or more layers of metal may be formed over the substrate to provide interconnectivity to bit lines 5, word line 4 and the power bussing for low reference voltage level Vss (step 56).

For a fabrication process utilizing at least three layers of polycrystalline material and/or polysilicon, the gate region of transmission gate transistors 23 and 24 may be formed in a first one of the second and third polysilicon layers, and the drain, source and channel regions thereof may be formed in a second one of the second and third polysilicon layers. In general terms, the gate region of transmission gate transistors 23 and 24 may be formed in a gate polysilicon layer and the drain, source and channel regions formed in a source/drain polysilicon layer, wherein the gate polysilicon may be disposed between the semiconductor substrate and the source/drain polysilicon layer or the source/drain polysilicon layer may be disposed between the semiconductor substrate and the gate polysilicon layer.

Figure 6:
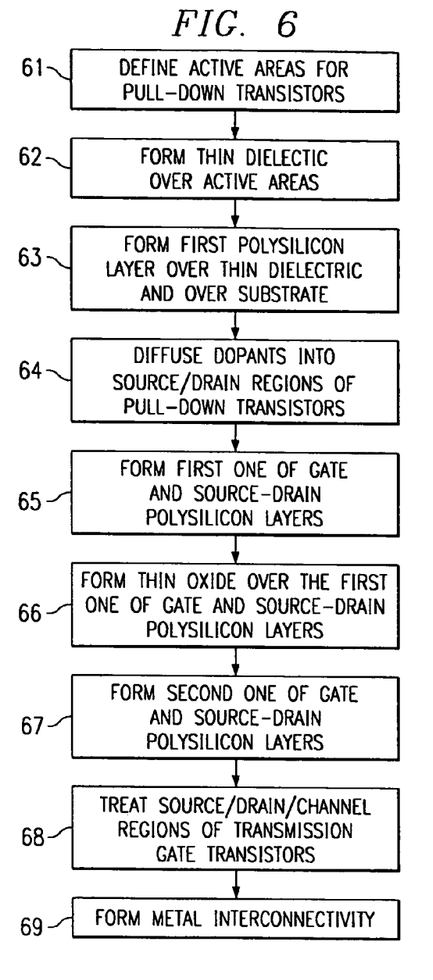

With respect to the method of fabricating the SRAM cell 3 in which drain, source and channel regions of the transmission gate transistors 23 and 24 are formed in the source/drain polysilicon layer and gate regions are formed in the gate polysilicon layer, reference is made to FIG. 6. The method includes the steps of forming pull-down transistors 21 and 22 (defining the active areas for pull-down transistors 21 and 22 at step 61; forming at step 62 a thin dielectric layer over the active areas so as to define the gate dielectric of pull-down transistors 21 and 22; forming the first polysilicon layer over the thin dielectric layer so as to define the gate region of pull-down transistors 21 and 22 at step 63; and diffusing dopants at step 64 into the drain and source regions of pull-down transistors 21 and 22).

The method further includes the step of forming a first one of the source/drain polysilicon layer and the gate polysilicon layer over the substrate at step 65. This steps defines either the drain, source and channel regions of transmission gate transistors 23 and 24 or the gate region thereof. Next, a thin dielectric layer is disposed over the recently formed polysilicon layer at step 66 so as to define the gate dielectric of transmission gate transistors 23 and 24. A second one of the source/drain polysilicon layer and the gate polysilicon layer is formed over the substrate at step 67. This forms either the gate region of transmission gate transistors 23 and 24 or the drain, source and channel regions thereof. Next, the drain, source and channel regions of transmission gate transistors 23 and 24 are treated at step 68 so that transmission gate transistors 23 and 24 have the desired threshold voltage to provide the appropriate subthreshold current when turned off. Thereafter, one or more layers of metal may be formed over the substrate to provide interconnectivity to bit lines 5, word line 4 and the power bussing for low reference voltage level Vss (step 69).

The design of SRAM cell 3 offers a number of advantages. Because SRAM cell 3 does not include pull-up transistors found in conventional SRAM cells (see FIG. 2), less polycrystalline semiconductor layers and/or semiconductor substrate area are needed to form SRAM cell 3. In addition, because SRAM cell 3 does not include connections to the high reference voltage Vdd, less metal layers are needed for power bus routing over SRAM cell 3. The reduced number of layers results in a significant savings in fabrication costs.

Figure 7:
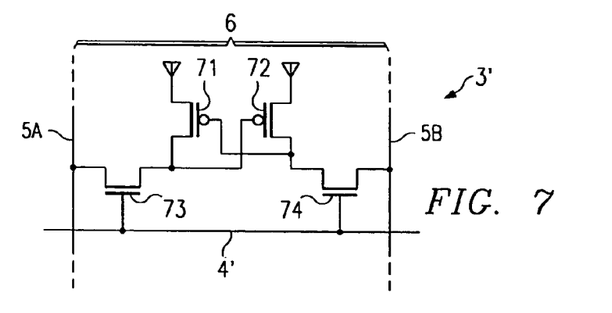
FIG. 7 is a schematic diagram of an SRAM cell from the SRAM device of FIG. 1 according to an embodiment of the present invention.

As stated above, SRAM cell 3 of FIG. 2 is without pull-up transistors that are typically found in conventional SRAM devices. In accordance with a second exemplary embodiment of the present invention, SRAM cell 3 may include pull-up transistors and exclude pull-down transistors. Referring to FIG. 7, there is shown such an SRAM cell 3', including a first pull-up transistor 71 and a second pull-up transistor 72. The drain terminal of pull-up transistor 71 is connected to the gate terminal of pull-up transistor 72, and the drain terminal of pull-up transistor 72 is connected to the gate terminal of pull-up transistor 71. The source terminals of pull-up transistors 71 and 72 are coupled to high reverence voltage source Vdd. SRAM cell 3' further includes a first transmission gate transistor 73 connected between bit line 5A and the drain terminal of pull-up transistor 71, and a second transmission gate transistor 74 connected between bit line 5B and the drain terminal of pull-up transistor 72. Pull-up transistors 71 and 72 may be p-channel MOS transistors and transmission gate transistors 73 and 74 may be n-channel MOS transistors, but it is understood that such transistors may be other transistor types as well. Word line 4', to which the gate terminals of transmission gate transistors 73 and 74 are connected, is driven to the high reference voltage level in order to couple SRAM cell 3' to bit lines 5A and 5B.

Transmission gate transistor 73 has an operating and/or threshold voltage characteristic such that a subthreshold current thereof maintains the drain terminal of pull-up transistor 71 at a voltage level representing a logic low level, when pull-up transistor 71 is turned off. Likewise, transmission gate transistor 74 has an operating and/or threshold voltage characteristic such that a subthreshold current thereof maintains the drain terminal of pull-up transistor 72 at a voltage level representing a logic low level, when pull-up transistor 72 is turned off. In this way and assuming that bit lines 5A and 5B are at the low reference voltage level between memory access operations, SRAM cell 3' is capable of performing a latching function without the need for pull-down transistors.

Due to the subthreshold current requirements for transmission gate transistors 73 and 74, transmission gate transistors 73 and 74 may be thin film transistors. Pull-up transistors 71 and 72 may be implemented as bulk (substrate) transistors. Consequently, the methods described above and illustrated in FIGS. 3A–3H and 4–6 may be utilized in fabricating SRAM cell 3', with the exception that the second metal layer 39 (FIG. 3G) is utilized to provide power bus routing for the high reference voltage source Vdd instead of the low reference voltage source Vss.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of storing a data value in a volatile memory device having at least one memory cell, a word line and a pair of bit lines being coupled to the at least one memory cell, the method comprising:
   driving the pair of bit lines to complementary voltage levels representative of a data value to be stored;
   driving the word line to a voltage level to select the at least one memory cell and to thereby cause the at least one memory cell to be in a logic state representative of the data value to be stored;
   driving the word line to a voltage level to deselect the at least one memory cell;
   following the step of driving the word line to a voltage level to deselect the at least one memory cell, discharging the pair of bit lines to a voltage representative of a logic low level; and
   during the step of discharging the pair of bit lines, allowing a leakage current to flow through at least one of the bit lines so that the memory cell maintains the data value stored therein.

2. The method of claim 1, wherein the pair of bit lines are driven to the complimentary voltage levels by a control circuitry.

3. The method of claim 1, wherein the pair of bit lines are coupled to a data input-output circuitry.

4. The method of claim 1, wherein the data value to be written to the at least one memory cell appears on the bit lines.

5. The method of claim 1, wherein the word line is coupled to an address decode circuitry.

6. A method of storing data value in a memory device, the method comprising:
   driving a pair of bit lines to a voltage representative of a logic high level;
   driving a word line to a voltage representative of a logic low level to select at least one memory cell and to thereby cause the at least one memory cell to be in a logic state representative of the data value to be stored;
   driving the word line to a voltage representative of a logic high level to deselect the at least one memory cell;
   wherein subsequent to driving the word line to the voltage representative of the logic high level to deselect the at least one memory cell, discharging the pair of bit lines to a voltage representative of a logic low level; and
   wherein during discharging the pair of bit lines, allowing a subthreshold current to flow through at least one of the bit lines so that the memory cell maintains the data value stored therein.

7. The method of claim 6, wherein the pair of bit lines are driven to the voltage representative of the logic high level by a control circuitry.

8. The method of claim 6, wherein the pair of bit lines are coupled to a data input-output circuitry.

9. The method of claim 6, wherein the data value to be written to the at least one memory cell appears on the bit lines.

10. The method of claim 6, wherein the word line is coupled to an address decode circuitry.

* * * * *